United States Patent [19]
Lin et al.

[11] Patent Number: 5,594,687
[45] Date of Patent: Jan. 14, 1997

[54] COMPLETELY COMPLEMENTARY MOS MEMORY CELL WITH TUNNELING THROUGH THE NMOS AND PMOS TRANSISTORS DURING PROGRAM AND ERASE

[75] Inventors: Jonathan Lin, Milpitas; Radu Barsan, Cupertino; Bradley A. Sharpe-Geisler, San Jose, all of Calif.

[73] Assignee: Advanced Micro Devices, Inc., Sunnyvale, Calif.

[21] Appl. No.: 447,991

[22] Filed: May 23, 1995

Related U.S. Application Data

[63] Continuation-in-part of Ser. No. 427,117, Apr. 21, 1995.
[51] Int. Cl.[6] ............................................. G11C 16/04
[52] U.S. Cl. ........................... 365/185.1; 365/185.08; 365/185.29
[58] Field of Search .......................... 365/185.1, 185.01, 365/185.29, 185.08; 326/44, 45, 49, 50

[56] References Cited

U.S. PATENT DOCUMENTS

| | | | |
|---|---|---|---|
| 4,829,203 | 5/1989 | Ashmore, Jr. | 307/469 |
| 4,858,185 | 8/1989 | Kowshik et al. | 365/181 |
| 4,862,019 | 8/1989 | Ashmore, Jr. | 307/469 |
| 4,866,307 | 9/1989 | Ashmore, Jr. | 307/469 |
| 4,885,719 | 12/1989 | Brahmbhatt | 365/182 |
| 5,148,391 | 9/1992 | Zagar | 365/96 |
| 5,170,373 | 12/1992 | Doyle | 365/185 |
| 5,270,587 | 12/1993 | Zagar | 307/469 |
| 5,272,368 | 12/1993 | Turner et al. | 257/315 |
| 5,404,328 | 4/1995 | Takemae | 365/185.1 |

*Primary Examiner*—David C. Nelms
*Assistant Examiner*—Son Mai
*Attorney, Agent, or Firm*—Fliesler, Dubb, Meyer & Lovejoy

[57] ABSTRACT

Circuitry added to CMOS memory cell configured to enable tunneling through its PMOS and NMOS transistors, the circuitry preventing leakage current during programming. The circuitry includes a separate NMOS pass gate for connecting the source of the NMOS transistor of the CMOS cell to Vss. The gate of the NMOS pass gate is controlled to turn off the NMOS transistor during programming through the PMOS transistor to prevent current loss on the Vss line. The NMOS pass gate further provides a means for enabling or disabling the NMOS transistor making the CMOS cell useful as an array cell for a PAL device.

9 Claims, 4 Drawing Sheets

COMPLETELY COMPLEMENTARY MOS MEMORY CELL WITH TUNNELING THROUGH THE NMOS AND PMOS TRANSISTORS DURING PROGRAM AND ERASE

CROSS-REFERENCE TO RELATED APPLICATION

This is a continuation-in-part of U.S. patent application Ser. No. 08/427,117 entitled "A CMOS Memory Cell With Gate Oxide Of Both NMOS And PMOS Transistors As Tunneling Window For Program And Erase", by Lin et al., filed Apr. 21, 1995, (hereinafter the cross-referenced application), and claims priority therefrom.

BACKGROUND OF THE INVENTION

1. Field of the Invention

The present invention relates to CMOS memory cells having PMOS and NMOS transistors with a common floating gate configured so that program and erase occurs through the gate oxide of the NMOS and PMOS transistors. More particularly, the present invention relates to circuitry and a method for utilizing the circuitry to reduce leakage current from the CMOS memory cell, and to enable the cell to be used in Programmable Array Logic (PAL) devices.

2. Description of the Related Art

FIG. 1 shows a circuit configuration of a CMOS memory cell 100 having a PMOS transistor 102 and an NMOS transistor 104 enabling utilization of tunneling through the NMOS and PMOS transistors during program and erase. The PMOS transistor 102 and NMOS transistor 104 have a common floating gate. The drains of transistors 102 and 104 connect together to form an output of the CMOS cell. A capacitor 106 is connected to couple bias voltage from an array control gate (ACG) node to the common floating gate. Bias voltage is provided to the source of the NMOS transistor 104 through a chip ground or Vss pin. A PMOS pass gate transistor 108 supplies a word control (WC) voltage to the source of PMOS transistor 102 as controlled by a word line (WL) voltage supplied to its gate. Transistor 108 is a PMOS device to avoid having to increase the WC voltage above the threshold of an NMOS device during programming. The CMOS memory cell 100 is described in detail, along with methods for its program and erase, in the cross-referenced application referred to above, and incorporated herein by reference.

FIG. 2 shows a layout for the cell of FIG. 1. The layout for the CMOS cell 100 is formed in a p type substrate. Capacitor 106 is formed using an n+ type implant region 110, including a programming junction region, formed in the p type substrate. Capacitor 106 also includes a gate oxide layer and a common floating gate (F.G.) 112 overlying the n+ implant region 110. Transistor 104 is formed using n+ implant regions 114 and 116 in the p type substrate with the gate oxide region and common floating gate 112 bridging the n+ implant regions 114 and 116. Transistor 102 is formed using p type regions 118 and 120 included in an n+ type well 122, which is included in the p type substrate. Transistor 102 also includes the gate oxide region and common floating gate 112 bridging the two p type regions 118 and 120. Transistor 108 is formed using a polysilicon (POLY) word line (WL) region 124 on the substrate bridging the p type implant regions 120 of transistor 102 with an additional p type implant region 126.

As indicated in the cross-referenced patent, the layout of FIG. 2 might be modified to include a double polysilicon layer to enable components of capacitor 106 to be stacked above the gate oxide layer and polysilicon floating gate 112 of transistors 102 and 104 to reduce required space on an integrated circuit for the CMOS cell of FIG. 1.

To program the CMOS memory cell 100, a voltage is applied between the array control gate (ACG) node of capacitor 106 and the source of the PMOS transistor 102 so that electrons transfer from the common floating gate to the source of the PMOS transistor 102. A high impedance is applied to the source of the NMOS transistor 104 during programming to prevent depletion of its channel which would occur if an NMOS transistor 104 were biased to remove electrons from the common floating gate.

To erase the CMOS memory cell 100, a voltage is applied between the array control gate (ACG) node of capacitor 106 and the source of the NMOS transistor 104 so that electrons transfer from the source of the NMOS transistor 104 to the common floating gate. A high impedance is further applied to the source of the PMOS transistor 102 during erase to prevent depletion of its channel which would occur if a PMOS transistor 102 were biased to add electrons to the floating gate.

Suggested voltages to apply to the CMOS memory cell 100 of FIG. 1 during program, erase and read are listed in Table I below.

TABLE I

|  | WC | WL | ACG | Vss |
|---|---|---|---|---|
| Program | 12 | 5 | 0 | Hiz |
| Erase | Hiz | 0 | 12 | 0 |
| Read | 5 | 0 | 2.5 | 0 |

As indicated in the cross-referenced patent, during read alternative voltages might be applied to CMOS cell 100. For instance, the CMOS cell can be utilized in a low power device, which during read will utilize a WC voltage of 3 V and an ACG voltage of ½ the WC voltage, or 1.5V.

To assure charge storage on the floating gate of the CMOS memory cell 100 is practical to turn on one of transistors 102 and 104 while turning the other off during read, Vcc may be applied through a voltage reference as WC to the source of the PMOS transistor 102. With Vcc applied directly from an external source to a chip Vcc pin, unregulated variations in Vcc occur. Such variations in Vcc require that an unacceptably high voltage be applied to the common floating gate to assure PMOS transistor 102 can be turned off. U.S. patent application Ser. No. 08/426,741, entitled "Reference for CMOS Memory Cell Having PMOS and NMOS Transistors With a Common Floating Gate" filed Apr. 21, 1994, (hereinafter, the CMOS reference patent application), incorporated herein by reference, discloses such a reference for a CMOS memory cell.

A CMOS memory cell, such as CMOS cell 100, is advantageous to use as a memory cell because it enables zero power operation, zero power operation indicating that the CMOS cell does not continually draw power when the CMOS cell is not changing states.

To assure zero power operation throughout an integrated circuit as well as maximum data retention, cell implants may be utilized in the PMOS transistor 104 and NMOS transistor 104. The cell implants include additional ion implantation to the channel between the source and drain of the PMOS and NMOS transistors 102 and 104 to alter the sum of the magnitude of the threshold of the PMOS and NMOS transistors to be substantially equal to, or greater than Vcc. Then, with Vcc applied to CMOS transistors following the CMOS memory cell, no current leakage will occur in the subsequent CMOS transistors. Further, utilizing cell implants, the magnitude of the thresholds of the PMOS and NMOS transistors may be set so that each is substantially equal to ½Vcc so that only a minimal amount of charge needs to be added or removed from the floating gate of a CMOS cell to turn the CMOS cell on or off.

With a CMOS memory cell programmed through the gate oxide of a PMOS transistor 102, as described above, current leakage can occur which can cause a disturb condition wherein electrons are injected onto the common floating gate in a CMOS cell which is not to be programmed. The current leakage during programming can occur because of charge storage in a large n well, such as n well 122 shown in FIG. 2. A large n well is typically shared by a column of cells which all receive the same voltage WC during programming of a particular cell in the column. As shown in Table I, for programming a particular cell, a WL voltage of 5 V is applied. However, for cells in the same column not to be programmed, a WL voltage of 12 V is applied. The 12 V WL voltage is applied to assure that the source of the PMOS transistors, such as 102, of unselected cells are floating, so that if the drains of the PMOS cells of unselected cells are also floating, no leakage current will occur. With no leakage current, deep depletion of the n well will occur, but inversion of the n well will not occur, to cause current leakage in an unselected cell.

However, a large number of cells in an array will require a long Vss line, the long Vss line then having a significant capacitive component, enabling charge storage. By connecting the source of NMOS transistors of unselected cells in a column to the Vss line, a current flow can occur to charge up the capacitance of the Vss line so that drains of NMOS transistors of cells in the column are not floating. With the drain of an NMOS transistor not floating, the drain of a corresponding PMOS transistor to which it is connected will not be floating, but conducting a leakage current. The leakage current occurs when the n well, such as n well 122, is driven from deep depletion to inversion. With such inversion, a disturb condition where electrons are injected onto the floating gate of the unselected cells can occur. Such current leakage during programming is not desirable.

SUMMARY OF THE INVENTION

The present invention includes additional circuitry to add to a CMOS memory cell configured so that program and erase occurs through the gate oxide of its NMOS and PMOS transistors, the additional circuitry preventing current leakage during programming.

The additional circuitry of the present invention further enables the CMOS memory cell to be utilized as an array cell in a PAL device.

The present invention includes a first pass gate transistor for connecting the source of the NMOS transistor of the CMOS cell to Vss. The gate of the first pass gate receives a word line (WL) control voltage which is controlled to turn off the NMOS pass gate during programming through the PMOS transistor to prevent leakage current on the Vss line. The first pass gate further provides a means for enabling or disabling the NMOS transistor, making the CMOS cell useful as an array cell of a PAL device.

With a PMOS pass gate connected to the source of the PMOS transistor of the CMOS cell, as shown in FIG. 1, the first pass gate of the present invention can be an NMOS device to provide an array cell layout requiring substantially the same space as the layout for the CMOS cell of FIG. 1. Further, by utilizing complementary PMOS and NMOS pass gates, the gates of the PMOS and NMOS pass gates can be connected together to receive a signal word line (WL) control voltage for program, erase and read operations, further conserving layout space for the CMOS cell.

BRIEF DESCRIPTION OF THE DRAWINGS

Further details of the present invention are explained with the help of the attached drawings in which.

DETAILED DESCRIPTION

Figure 1:
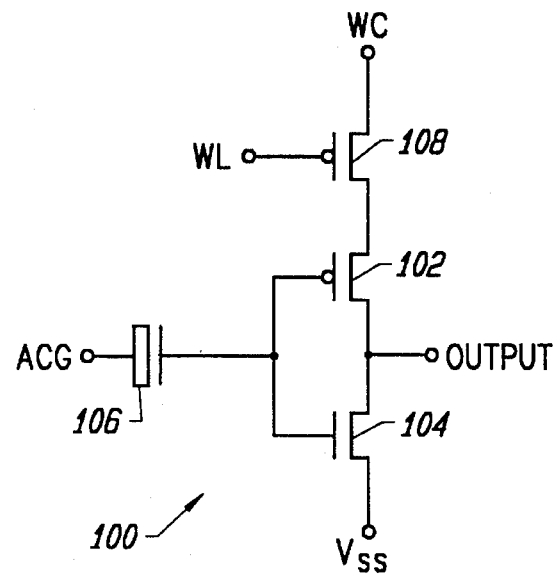
FIG. 1 shows a circuit configuration of a conventional CMOS memory cell utilizing tunnelling through the oxide layers of the PMOS and NMOS transistors of the CMOS cell during program and erase.
Figure 3:
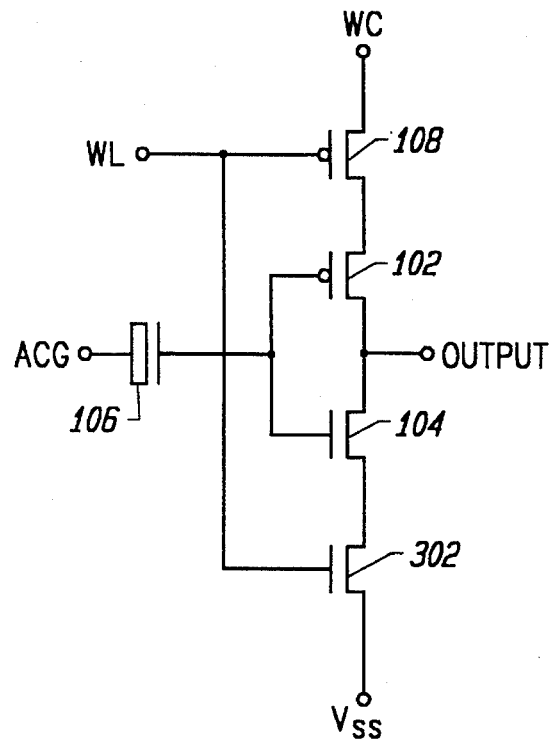
FIG. 3 shows the CMOS memory cell of FIG. 1 with additional circuitry to prevent leakage current during programming.

FIG. 3 shows the pass gate transistor 302 of the present invention which is added to the CMOS memory cell circuit of FIG. 1. The pass gate 302 has a source to drain path connecting the source of NMOS transistor 104 to Vss. The gate of pass gate transistor 302 is shown connected to the gate of PMOS pass gate transistor 108 to receive the word line (WL) voltage, but may also be provided separate from the gate of transistor 108 to receive a separate WL voltage.

Figure 2:
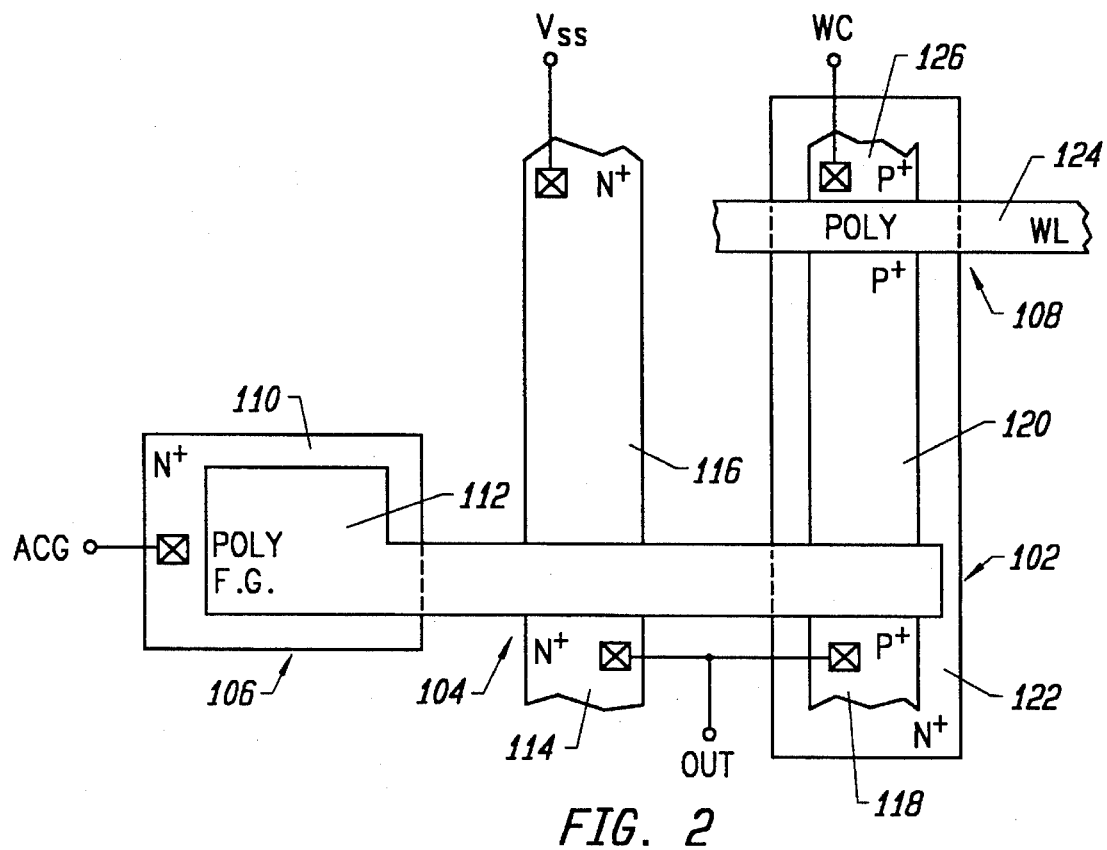
FIG. 2 shows a layout for the CMOS cell of FIG. 1.
Figure 4:
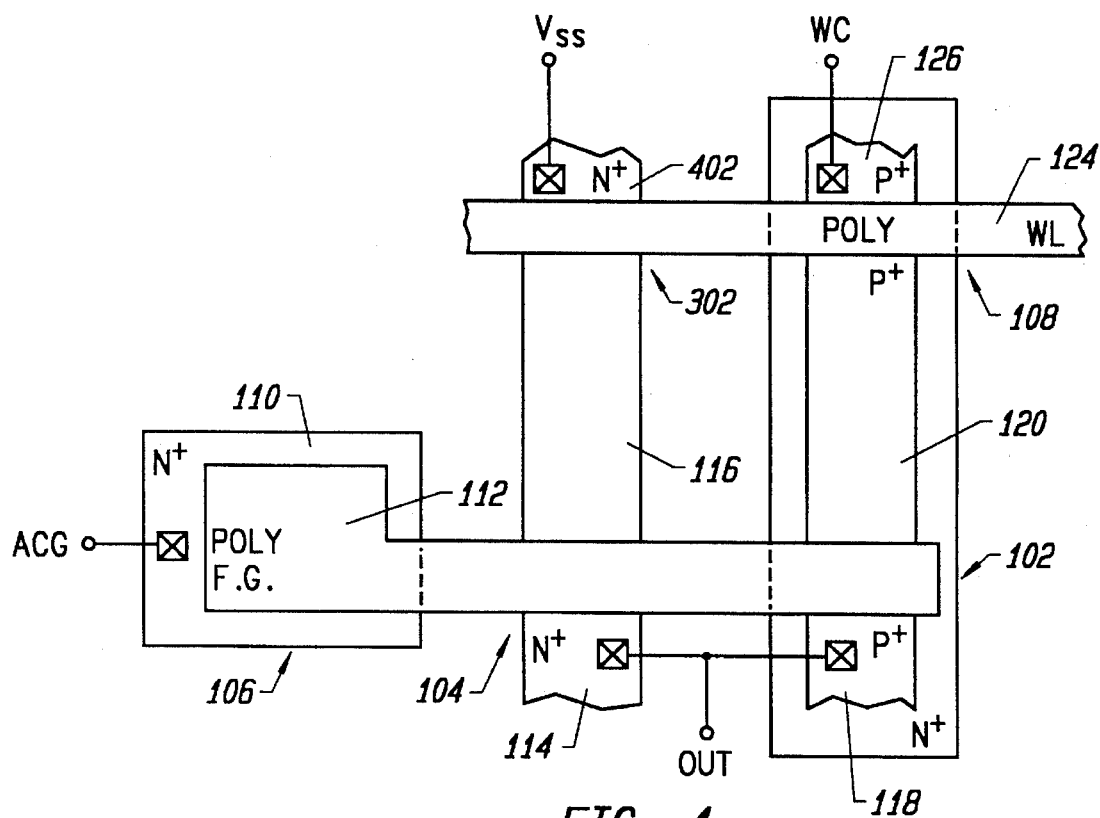
FIG. 4 shows a layout for the CMOS cell of FIG. 3.

FIG. 4 shows a layout for the cell of FIG. 3. As shown, the layout of FIG. 4 includes the regions of the layout of FIG. 2 with additional regions added for transistor 302. Transistor 302 is formed using the n+ implant region 116 of transistor 104 along with an additional n+ implant region 402. Transistor 302 further includes the polysilicon (POLY) word line (WL) region 124 used for transistor 108. The POLY WL region 124 is utilized to bridge the two p type implant regions 116 and 402.

Although transistor 302 is shown as an NMOS transistor, transistor 302 may be a PMOS transistor. By using an NMOS transistor, as shown in FIG. 4, the layout for the CMOS cell can be configured to occupy substantially the same space as in the layout of FIG. 2 because of the unoccupied space above transistor 114. However, using a PMOS transistor for transistor 302, the layout space required for the CMOS cell may increase.

Further, PMOS transistor 108 can be substituted with an NMOS transistor, but at the expense of the CMOS cell layout possibly occupying more space. Additionally, by making PMOS transistor 108 an NMOS device, a voltage drop from WC through the transistor 108 to the source of PMOS transistor 102 would occur when the transistor 108 conducts, unlike with transistor 108 being a PMOS device as mentioned previously.

Additionally, although the wordline of transistor 302 is shown connected to the wordline of PMOS transistor 108, separate wordlines may be provided to transistors 302 and 108. Again, however, with separate wordlines, the layout for the CMOS cell may occupy more space on a chip.

As with the cross-referenced patent, the layout of FIG. 4 might also be modified to include a double polysilicon layer to enable components of capacitor 106 to be stacked above the gate oxide layer and polysilicon floating gate 112 of transistors 102 and 104 to further reduce required space on an integrated circuit for the CMOS cell of the present invention.

To program and erase the CMOS cell of FIG. 3, similar voltages are applied to the WC, ACG and Vss lines as for programming the CMOS cell of FIG. 1, as indicated in Table II shown below.

TABLE II

|  | WC | WL | ACG | Vss |
|---|---|---|---|---|
| Program | 12 | 0 | 0 | Hiz |
| Erase | Hiz | 5 | 12 | 0 |

Further, for unselected cells in a column receiving the same WC voltage of 12 V during programming, a WL voltage of 12 V is applied to turn off the PMOS pass gates, such as PMOS pass gate 108, in those cells. However, the WL voltage applied during programming to both selected and unselected cells is slightly altered to take advantage of the presence of NMOS pass gate 302, as described below.

For the circuitry of FIG. 3, a WL voltage of 0 V is utilized during programming. With WL being 0 V, NMOS pass gate 302 is off, so the drain of NMOS pass gate 302 will be floating, assuring the drain of transistor 102 is floating. Further, with NMOS pass gate 302 being off, a path to Vss is removed, so even though the Vss line is floating, with a long Vss line, its capacitive component will not provide a charge storage element to provide a path for leakage current in unselected cells.

For the circuit of FIG. 1, during program, a WL voltage of 5 V was suggested to turn on PMOS pass gate 108 to pass the WC voltage to PMOS transistor 102. However, with a WL voltage of 0 V, PMOS pass gate 108 will still be on. PMOS pass gate 108 will be on as long as WL−WC>Vtp, where Vtp is the threshold of PMOS pass gate 108. A 5 V value was utilized for the WL voltage with the circuit of FIG. 1 to turn on the PMOS pass gate 108, but with a difference from the WC voltage to prevent possible damage to the gate oxide layer of PMOS pass gate 108. By improving the quality of the gate oxide layer of PMOS pass gate 108, a voltage difference as great as 12 V between WC and WL, however, damage to the gate oxide layer of transistor 108 can be prevented.

For the circuitry of FIG. 3, a WL voltage of 5 V is utilized during erase. With WL being 5 V, NMOS pass gate 302 will be on to allow the source of NMOS transistor 104 to receive the voltage on the Vss line of 0 V. With WL being 5 V, PMOS pass gate 108 will be off to enable the source of transistor 102 to float, irrespective of the WC signal floating.

For the circuit of FIG. 1, during erase, a WL voltage of 0 V was suggested as being applied to turn on PMOS pass gate 108 to pass the WC voltage, which is floating, to the source of PMOS transistor 102. However, as with the circuit of FIG. 3, a WL voltage of 5 V could be applied to the PMOS pass gate 108 in the circuit of FIG. 1 to likewise cause the source of PMOS transistor 102 to be floating. With the gates of PMOS pass gate 108 and NMOS pass gate 302 connected together, a WL voltage of 5 V, however, is desirable to assure that NMOS pass gate 302 is on to pass the 0 V Vss voltage to NMOS transistor 104.

To read using the CMOS cell of FIG. 3, similar suggested voltages are applied to the WC, ACG and Vss lines as when reading with the CMOS cell of FIG. 1, as indicated in Table III below.

TABLE II

|  | WC | WL | ACG | Vss |
|---|---|---|---|---|
| Read | 5 | 2.5 | 2.5 | Hiz |

However, the WL voltage applied during read is slightly altered to account for the presence of NMOS pass gate 302, as described below.

For the circuitry of FIG. 3, a WL voltage of 2.5 V is indicated as being utilized during read. The WL voltage of 2.5 V is utilized, because during read, for enabled CMOS cells, a connection is necessary from the source of PMOS transistor 102 to WC and from the source of the NMOS transistor 104 to Vss. For NMOS pass gate 302 to turn on, its gate to source voltage must be greater than its threshold, which is typically 0.7 V. For transistor 108 to turn on, its gate to source voltage must be less than WC minus its threshold, which is also typically 0.7 V. So, during read, for an enabled CMOS cell, it is desirable to have 0.7<WL<4.3. A WL value of 2.5 was arbitrarily selected to be within this range.

For the circuit of FIG. 1, during program, a WL voltage of 0 V was utilized. However, a WL voltage of 0 V would turn off the NMOS pass gate 302 of FIG. 3. With separate WL voltages applied to the NMOS pass gate 302 and PMOS pass gate 108, a WL voltage of 0 V could be applied to the PMOS pass gate 108, while a WL voltage of 5 V is applied to the NMOS pass gate 302 to enable the CMOS cell.

As with the voltages described for applying during read with the circuitry of FIG. 1, the voltages listed above are only suggested values. For instance, the CMOS cell can be utilized in a low power device, which during read will utilize a WC voltage of 3 V, an ACG voltage of ½ the WC voltage, or 1.5 V. Further, the present invention might utilize voltages at the WC and ACG nodes as applied by a reference, as described in the CMOS reference patent application, discussed previously.

Further, as with the cross-referenced patent application, discussed previously, the present invention might include cell implants in PMOS transistor 102 and NMOS transistor 104 to maximize data retention in CMOS memory cells, as well as to assure zero power operation in subsequent CMOS circuitry.

Figure 5:
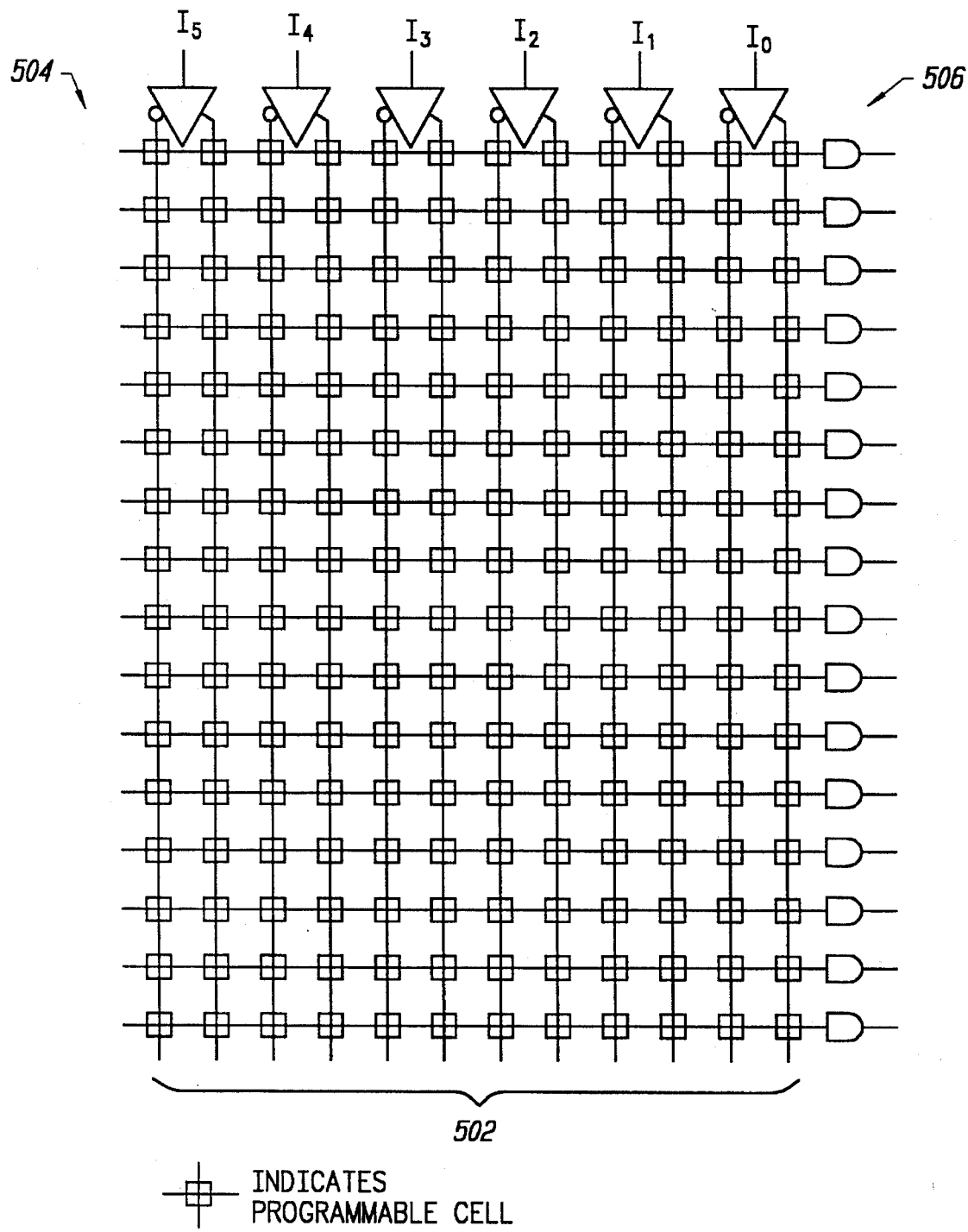
FIG. 5 shows a portion of a PAL device.

Unlike with the CMOS cell of FIG. 1, with the NMOS pass gate 302 added, as in FIG. 3, the CMOS cell can be utilized in an array cell of a programmable array logic (PAL) device. FIG. 5 shows a portion of a PAL device including an array of programmable cells 502. The PAL device also includes input buffers 504 receiving input signals I$_{0-5}$ and providing true and complement outputs as enabling signals to cells in columns of the programmable cells 502. The array cells are connected in rows to sense amplifiers 506. Each array cell is further programmed to be on or off when a select signal is received from one of input signals I$_{0-5}$.

Figure 6:
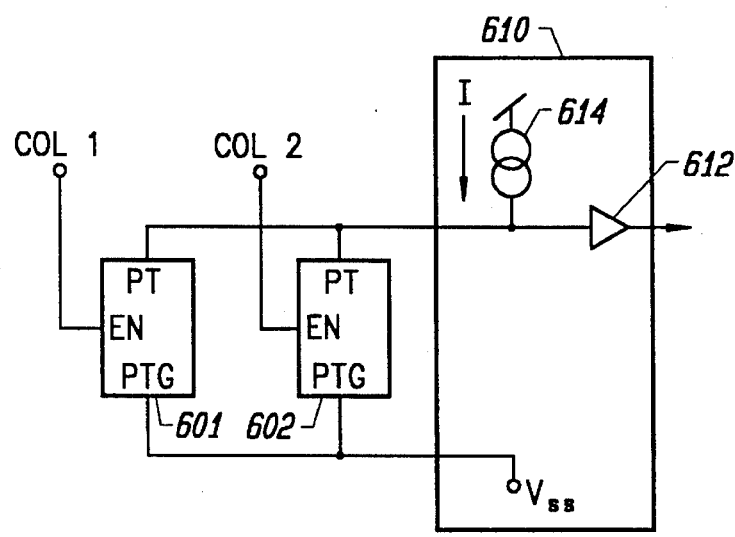
FIG. 6 illustrates details of the connections of array cells from FIG. 5.

FIG. 6 illustrates details of the connections of array cells 502 from FIG. 5. FIG. 6 shows the connections of two array cells 601 and 602 from a row in array cells 502. As shown, each array cell 601 and 602 receives an input signal COL1 and COL2 from one of the input buffers 504 as an enable signal EN. Each of cells 601 and 602 further has one connection to a product term (PT) line and an additional connection to a product term ground (PTG) line. The PT line forms an input to an inverter 612 included in one of the sense amplifiers 610 of sense amplifiers 506. The PTG line provides a connection to Vss in the sense amplifier 610. The sense amplifier 610 also includes a current source 614 connected to the input of the inverter 612. Array cells 601 and 602 may be programmed to provide a connection from the PT to the PTG line, the connection being provided when the array cell receives an appropriate EN signal.

Because the CMOS cell of FIG. 1 does not include a means to enable or disable the NMOS transistor 104, apart from programming its floating gate, the circuitry of FIG. 1 is not practical for use as an array cell for a PAL device. The CMOS memory cell of FIG. 3, however, does include an NMOS pass gate 302 which provides a means to enable or disable NMOS transistor 104, apart from programming its floating gate.

To provide the CMOS cell of FIG. 3 as one of array cells 601 and 602 of FIG. 6, the drain of NMOS transistor 104 of the CMOS cell of FIG. 3 is connected to the PT line, the Vss connection at the source of NMOS pass gate 302 is connected to the PTG line, and the WL node is connected to receive an EN signal. The WL signal of 2.5 volts may then be applied to enable the CMOS cell, since NMOS pass gate 302 will be on creating a path from PT to PTG if NMOS transistor 104 is appropriately programmed. Further, a WL signal of 0.0 volts may then be applied to disable the CMOS cell, since NMOS pass gate 302 will be off, disabling any path from PT to PTG.

Because an enable voltage, such as 2.5 V, can be applied to the CMOS cell of FIG. 3 to enable both PMOS pass gate 108 and NMOS pass gate 302, the CMOS cell of FIG. 3 can also be selectively configured to function as a switch to control pass gates in a switch matrix directing signals, such as $I_{0-5}$ of FIG. 5. The CMOS cell of FIG. 3 may similarly be utilized as a switch utilized in a field programmable gate array (FPGA).

Figure 7:
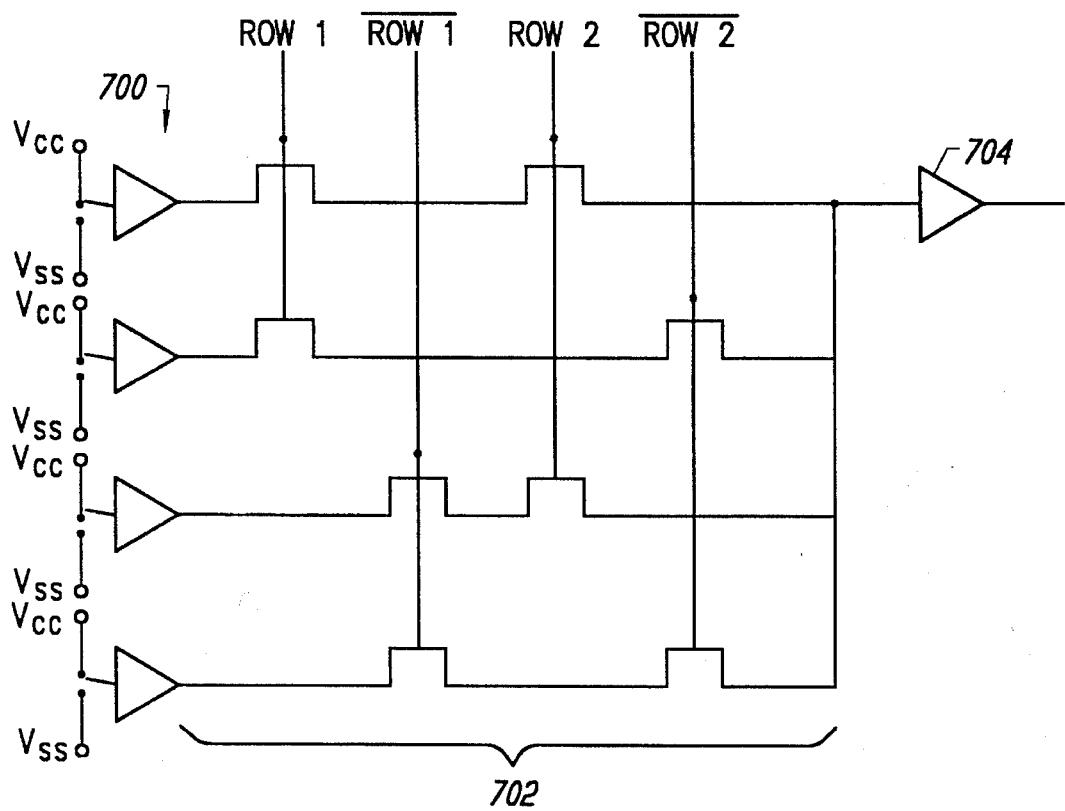
FIG. 7 illustrates the configuration of circuitry in a PAL or FPGA device wherein a programmable CMOS cell may be utilized as a switch.

FIG. 7 illustrates the configuration of circuitry in a PAL or FPGA device wherein a programmable CMOS cell may be utilized as a switch. FIG. 7 includes array cells 700 individually connecting Vcc or Vss through pass gates 702 to a buffer 704 as controlled by signals ROW1, $\overline{ROW1}$, ROW2 and $\overline{ROW2}$. With a WL voltage applied to turn on PMOS pass gate 108 and NMOS pass gate 302, the CMOS cell of FIG. 3 can then be programmed to function as one of array cells 700. By appropriately programming the floating gate of the CMOS cell of FIG. 3, the CMOS cell provides a connection either to Vcc (through WC), or to Vss at its output, as required for array cells 700.

Although the invention has been described above with particularity, this was merely to teach one of ordinary skill in the art how to make and use the invention. Many modifications will fall within the scope of the invention, as that scope is defined by the claims which follow.

What is claimed is:

1. A memory cell comprising:

a common floating gate;

a capacitor having a first terminal forming a control gate and a second terminal coupled to the common floating gate;

an NMOS transistor having a source coupled to Vss, a drain, a channel formed between its source and drain, and a tunneling oxide region and the common floating gate overlying its channel;

a PMOS transistor having a source, a drain coupled to the drain of the NMOS transistor, a channel formed between its source and drain, and a tunneling oxide region and the common floating gate overlying its channel; and a first pass gate having a source to drain path coupling the source of the NMOS transistor to Vss, and a gate.

2. The memory cell of claim 1 wherein the first pass gate is an NMOS transistor.

3. The memory cell of claim 1 further comprising a second pass gate having a source to drain path coupling the source of the PMOS transistor to a voltage reference, and a gate.

4. A memory cell comprising:

a common floating gate;

a capacitor having a first terminal forming a control gate and a second terminal coupled to the common floating gate;

an NMOS transistor having a source coupled to Vss, a drain, a channel formed between its source and drain, and a tunneling oxide region and the common floating gate overlying its channel; and a PMOS transistor having a source, a drain coupled to the drain of the NMOS transistor, a channel formed between its source and drain, and a tunneling oxide region and the common floating gate overlying its channel;

an NMOS pass gate having a drain coupled to the source of the NMOS transistor, a source connected to Vss, and a gate; and a PMOS pass gate having a drain connected to the source of the PMOS transistor, a source connected to a voltage reference, and a gate.

5. The memory cell of claim 4, wherein the gate of the NMOS pass gate is connected to the gate of the PMOS pass gate.

6. A method of programming a CMOS memory cell, the CMOS memory cell including an NMOS and a PMOS transistor having a common floating gate, and each including a tunneling oxide region, a capacitor having a first terminal forming a control gate and a second terminal coupled to the common floating gate, and a first pass gate having a source to drain path coupling a source of the NMOS transistor to $V_{ss}$, wherein programming results in electrons being removed from the common floating gate, programming comprising the steps of:

applying a voltage between the control gate and a source of the PMOS transistor so that electrons transfer from the common floating gate to the source of the PMOS transistor; and applying a voltage to a gate of the first pass gate so that the first pass gate turns off creating a high impedance at the source of the NMOS transistor.

7. A method of programming and erasing a CMOS memory cell, the CMOS memory cell including an NMOS and a PMOS transistor having a common floating gate, and each including a tunneling oxide region, a capacitor having a first terminal forming a control gate and a second terminal coupled to the common floating gate, a first pass gate having a source to drain path coupling a source of the NMOS transistor to $V_{ss}$, and a second pass gate having a source to drain path coupling the source of the PMOS transistor to a voltage reference, wherein programming results in electrons being removed from the common floating gate, programming comprising the steps of:

applying a voltage between the control gate and a source of the PMOS transistor so that electrons transfer from the common floating gate to the source of the PMOS transistor; and applying a voltage to a gate of the first pass gate so that the first pass gate turns off creating a high impedance at a source of the NMOS transistor, and wherein erasing results in electrons being added to the common floating gate, erasing comprising the steps of:

applying a voltage to the gate of the first pass gate so that the first pass gate turns on, while applying a voltage between the control gate and the source of the NMOS transistor so that electrons transfer from the source of the NMOS transistor to the common floating gate; and applying a voltage to a gate of the second pass gate so that the second pass gate turns off creating a high impedance at the source of the PMOS transistor.

8. A method of programming and erasing a CMOS memory cell, the CMOS memory cell including an NMOS and a PMOS transistor having a common floating gate, and each including a tunneling oxide region, a capacitor having a first terminal forming a control gate and a second terminal coupled to the common floating gate, an NMOS pass gate having a source to drain path coupling a source of the NMOS transistor to $V_{ss}$, and a PMOS pass gate having a source to drain path coupling the source of the PMOS transistor to a voltage reference, wherein programming results in electrons being removed from the common floating gate, programming comprising the steps of:

applying a voltage to gates of the NMOS and PMOS pass gates so that the PMOS pass gate turns on and the NMOS pass gate turns off creating a high impedance at a source of the NMOS transistor; and applying a voltage between the control gate and the source of the PMOS pass gate so that electrons can transfer from the common floating gate to a source of the PMOS transistor, and wherein erasing results in electrons being added to the common floating gate, erasing comprising the steps of:

applying a voltage to the gates of the NMOS and PMOS pass gates so that the NMOS pass gate turns on, while the PMOS pass gate turns off, creating a high impedance at the source of the PMOS transistor; and applying a voltage between the control gate and the source of the NMOS transistor so that electrons transfer from the source of the NMOS transistor to the common floating gate.

9. A programmable logic device (PLD) receiving an input, the PLD comprising:

a sense amplifier having a product term (PT) input and a product term ground (PTG) input;

a plurality of memory cells, each comprising:

a common floating gate;

a capacitor having a first terminal forming a control gate and a second terminal coupled to the common floating gate;

an NMOS transistor having a source coupled to Vss, a drain coupled to the PT input, a channel formed between its source and drain, and a tunneling oxide region and the common floating gate overlying its channel;

a PMOS transistor having a source, a drain coupled to the PT input, a channel formed between its source and drain, and a tunneling oxide region and the common floating gate overlying its channel; and a first pass gate having a source to drain path coupling the source of the NMOS transistor to the PTG input, and a gate connected to the PLD input.

* * * * *